US009521306B2

(12) United States Patent
Kelly et al.

(10) Patent No.: US 9,521,306 B2
(45) Date of Patent: Dec. 13, 2016

(54) APPARATUS AND METHOD FOR COMPRESSIVE IMAGING AND SENSING THROUGH MULTIPLEXED MODULATION VIA SPINNING DISKS

(71) Applicants: Kevin F Kelly, Houston, TX (US); Richard G Baraniuk, Houston, TX (US); Gary Woods, Houston, TX (US); Ting Sun, Albequerque, NM (US); Matthew Turner, Moscow, ID (US)

(72) Inventors: Kevin F Kelly, Houston, TX (US); Richard G Baraniuk, Houston, TX (US); Gary Woods, Houston, TX (US); Ting Sun, Albequerque, NM (US); Matthew Turner, Moscow, ID (US)

(73) Assignee: William Marsh Rice University, Houston, TX (US)

( * ) Notice: Subject to any disclaimer, the term of this patent is extended or adjusted under 35 U.S.C. 154(b) by 0 days.

(21) Appl. No.: 14/811,080

(22) Filed: Jul. 28, 2015

(65) Prior Publication Data
US 2016/0014310 A1 Jan. 14, 2016

Related U.S. Application Data

(63) Continuation of application No. 13/511,475, filed as application No. PCT/US2010/059343 on Dec. 7, 2010, now Pat. No. 9,124,755.
(Continued)

(51) Int. Cl.
H04N 5/225 (2006.01)
H04N 3/08 (2006.01)
H04N 5/335 (2011.01)
H03M 7/30 (2006.01)
H04N 19/90 (2014.01)

(52) U.S. Cl.
CPC ......... *H04N 5/2254* (2013.01); *H03M 7/3062* (2013.01); *H04N 3/08* (2013.01); *H04N 5/335* (2013.01); *H04N 19/90* (2014.11)

(58) Field of Classification Search
CPC ............ H04N 5/23229; H04N 5/23232; H04N 5/23235; H04N 5/349
See application file for complete search history.

(56) References Cited

U.S. PATENT DOCUMENTS 5,414,623 A 5/1995 Lu et al.
7,271,747 B2 9/2007 Baraniuk
(Continued)

FOREIGN PATENT DOCUMENTS

WO 2008-129553 10/2008

OTHER PUBLICATIONS

E. Candes and T. Tao, Near Optimal Signal Recovery from Random Projections and Universal Encoding Strategies, Caltech and UCLA.
(Continued)

*Primary Examiner* — James Hannett
(74) *Attorney, Agent, or Firm* — 24IP Law Group; Timothy R DeWitt

(57) ABSTRACT

Compressive imaging apparatus employing multiple modulators in various optical schemes to generate the modulation patterns before the signal is recorded at a detector. The compressive imaging apparatus is equally valid when applying compressive imaging to structured light embodiments where the placement is shifted from the acquisition path between the subject and the detector into the illumination path between the source and the subject to be imaged.

20 Claims, 6 Drawing Sheets

Related U.S. Application Data

(60) Provisional application No. 61/267,397, filed on Dec. 7, 2009.

(56) References Cited

U.S. PATENT DOCUMENTS

| | | |
|---|---|---|
| 7,511,643 B2 | 3/2009 | Baraniuk |
| 2004/0218172 A1 | 11/2004 | DeVerse |
| 2006/0029279 A1 | 2/2006 | Donoho |
| 2006/0239336 A1 | 10/2006 | Baraniuk |
| 2008/0129568 A1 | 6/2008 | Brady |
| 2008/0198235 A1 | 8/2008 | Chen |
| 2008/0219579 A1 | 9/2008 | Aksyuk et al. |
| 2010/0103309 A1 | 4/2010 | Stern |
| 2012/0213270 A1 | 8/2012 | Baraniuk et al. |

OTHER PUBLICATIONS

Donoho, David L., "Compressed Sensing," Sep. 14, 2004, Stanford University.
Candès, E., Romberg, J., Tao, T., "Robust uncertainty principles: Exact signal reconstruction from highly incomplete frequency information," IEEE Trans. Inform. Theory 52 (2006) 489-509.
David Donoho, "Compressed sensing," IEEE Transactions on Information Theory, vol. 52, Issue 4, Apr. 2006, pp. 1289-1306.
Pitsianis, N.P., Brady, D.J., Sun, X.: "Sensor-layer image compression based on the quantized cosine transform," SPIE Visual Information Processing XIV (2005).
Brady, D.J., Feldman, M., Pitsianis, N., Guo, J.P., Portnoy, A., Fiddy, M., "Compressive optical Montage photography," SPIE Photonic Devices and Algorithms for Computing VII (2005).
Lane, P.M., Elliott, R.P., MacAulay, C.E., "Confocal microendoscopy with chromatic sectioning," Proc. SPIE. vol. 4959 (2003) 23-26.
DeVerse, R.A., Coifman, R.R., Coppi, A.C., Fateley, W.G., Geshwind, F., Hammaker, R.M., Valenti, S., Warner, F.J., "Application of spatial light modulators for new modalities in spectrometry and imaging," Proc. SPIE. vol. 4959 (2003).
Candès, E., Tao, T., "Error correction via linear programming," (2005) Preprint.
M. A. Davenport, P. T. Boufounos, M. B. Wakin, and R. G. Baraniuk, "Signal processing with compressive measurements", Journal of Selected Topics in Signal Processing, vol. 4, No. 2, pp. 445-460, Apr. 2010.
Tropp, J., Gilbert, A.C., "Signal recovery from partial nformation via orthogonal matching pursuit," (2005) Preprint.
Mallat, S. and Zhang, Z., "Matching Pursuit with Time Frequency Dictionaries", (1993) IEEE Trans. Signal Processing 41(12): 3397-3415.
Duarte, M.F., Wakin, M.B., Baraniuk, R.G., "Fast reconstruction of piecewise smooth signals from random projections," Proc. SPARS05, Rennes, France (2005).
Cormode, G., Muthukrishnan, S., "Towards an algorithmic theory of compressed sensing," DIMACS Tech. Report 2005-40 (2005).
Pearl, J., "Fusion, propagation, and structuring in belief networks", (1986) Artificial Intelligence, 29(3): 241-288.
Tibshirani, R., "Regression shrinkage and selection via the lasso", (1996) J. Royal. Statist. Soc B., 58(1): 267-288.
Efron, B., Hastie, T., Johnstone, I., Tibshirani, R., "Least Angle Regression", (2004) Ann. Statist. 32(2): 407-499.
Chen, X., Donoho, D., Saunders, M., "Atomic Decomposition by Basis Pursuit", (1999), SIAM Journal on Scientific Computing 20(1): 33-61.
Dempster, Laird, N., Rubin, D., "Maximum likelihood from incomplete data via the EM algorithm", (1997) Journal of the Royal Statistical Society, Series B, 39(1): 1-38.
Wakin, M, and Baraniuk, R., "Random Projections of Signal Manifolds" IEEE ICASSP 2006, May 2006.
Dasgupta, S., Gupta, A., "An elementary proof of the Johnson-Lindenstrauss lemma," Tech. Rep. TR-99-006, Berkeley, CA, 1999.

APPARATUS AND METHOD FOR COMPRESSIVE IMAGING AND SENSING THROUGH MULTIPLEXED MODULATION VIA SPINNING DISKS

CROSS-REFERENCE TO RELATED APPLICATIONS

The present application is a continuation of U.S. patent application Ser. No. 13/511,475, which was a 371 national stage application of PCT Application No. PCT/US2010/059343 which was filed on Dec. 7, 2010, and claimed the benefit of the filing date of U.S. Provisional Patent Application Ser. No. 61/267,397 entitled "Apparatus for Compressed Imaging and Sensing Through Multiplexed Modulation" and filed by the present inventors on Dec. 7, 2009.

The aforementioned patent applications are hereby incorporated by reference in its entirety

STATEMENT REGARDING FEDERALLY SPONSORED RESEARCH OR DEVELOPMENT

The present invention was made with funding under government contract number DARPA/ONR N00014-06-1-0610. The government has certain rights in the invention.

BACKGROUND OF THE INVENTION

1. Field of the Invention

The present invention relates to imaging devices such as cameras, video cameras, microscopes, and other visualization techniques, and more particularly, to the acquisition of images and video using fewer measurements than previous techniques.

2. Brief Description of the Related Art

The large amount of raw data acquired in a conventional digital image or video often necessitates immediate compression in order to store or transmit that data. This compression typically exploits a priori knowledge, such as the fact that an N-pixel image can be well approximated as a sparse linear combination of K<<N wavelets. These appropriate wavelet coefficients can be efficiently computed from the N pixel values and then easily stored or transmitted along with their locations. Similar procedures are applied to videos containing F frames of P pixels each; where N=FP denotes the number of video "voxels".

This process has two major shortcomings. First, acquiring large amounts of raw image or video data (large N) can be expensive, particularly at wavelengths where CMOS or CCD sensing technology is limited. Second, compressing raw data can be computationally demanding, particularly in the case of video. While there may appear to be no way around this procedure of "sample, process, keep the important information, and throw away the rest," a new theory known as Compressive Sensing (CS) has emerged that allows for directly acquiring a compressed digital representation of a signal without first sampling that signal. See Candès, E., Romberg, J., Tao, T., "Robust uncertainty principles: Exact signal reconstruction from highly incomplete frequency information," IEEE Trans. Inform. Theory 52 (2006) 489-509; David Donoho, "Compressed sensing," IEEE Transactions on Information Theory, Volume 52, Issue 4, April 2006, Pages: 1289-1306; and Candès, E., Tao, T., "Near optimal signal recovery from random projections and universal encoding strategies," (2004) Preprint.

Efforts on compressed imaging include Pitsianis, N. P., Brady, D. J., Sun, X.: "Sensor-layer image compression based on the quantized cosine transform," SPIE Visual Information Processing XIV (2005) and Brady, D. J., Feldman, M., Pitsianis, N., Guo, J. P., Portnoy, A., Fiddy, M., "Compressive optical MONTAGE photography," SPIE Photonic Devices and Algorithms for Computing VII (2005), which employ optical elements to perform transform coding of multispectral images. Two notable previous DMD-driven applications involve confocal microscopy (Lane, P. M., Elliott, R. P., MacAulay, C. E., "Confocal microendoscopy with chromatic sectioning," Proc. SPIE. Volume 4959 (2003) 23-26) and micro-optoelectromechanical (MOEM) systems (DeVerse, R. A., Coifman, R. R., Coppi, A. C., Fateley, W. G., Geshwind, F., Hammaker, R. M., Valenti, S., Warner, F. J., "Application of spatial light modulators for new modalities in spectrometry and imaging," Proc. SPIE. Volume 4959 (2003)). The beauty of compressive sensing is that either Gaussian or Bernoulli white-noise patterns serve as appropriate basis functions allowing them to be disassembled into sets of two or more transmissive or reflective modulators where even intermediary combinations would still serve as mathematically acceptable patterns for encoding the image signal.

SUMMARY OF THE INVENTION

In a preferred embodiment, the present invention is an imaging system. The imaging system comprises a multilayered modulator for modulating an incident light field by a series of patterns, means for optically computing inner products between the light field and the series of patterns; and means for recovering a signal based upon the inner products and an algorithm. The algorithm may be, for example, at least one of a Greedy reconstruction algorithm, Matching Pursuit, Orthogonal Matching Pursuit, Basis Pursuit, group testing, LASSO, LARS, expectation-maximization, Bayesian estimation algorithm, belief propagation, wavelet-structure exploiting algorithm, Sudocode reconstruction, reconstruction based on manifolds, $l_1$ reconstruction, $l_0$ reconstruction, and $l_2$ reconstruction. The multilayered modulator may comprise first and second disks, wherein the first and second disks spin at different speeds. An imaging plane in the first disk may be aligned diagonally with the first disk. The spindle of the first disk may be aligned with a spindle of the second disk. This embodiment may also be easily extended to three or more disks.

In another embodiment, the multilayered modulator comprises first and second cylinders, wherein the first cylinder is nested at least partially within the second cylinder. In yet another embodiment, the multilayered modulator comprises first and second tapes, wherein the first and second tapes move orthogonal to one another. In other embodiments, the tapes can move at any non-zero angle. A variation of this embodiment also includes using a single tape that is then threaded to overlap on itself in a specific region in either a parallel or orthogonal manner. In another embodiment, the multilayered modulator comprises a plurality of masks, the masks having partial patterns that are translated horizontally and vertically relative to one another. In a preferred embodiment, the present invention is an imaging system. The imaging system comprises a multilayered modulator for modulating an incident light field by a series of patterns, means for optically computing inner products between the light field and the series of patterns; and means for recovering a signal based upon the inner products and an algorithm. The algorithm may be, for example, at least one of a Greedy reconstruction algorithm, Matching Pursuit, Orthogonal Matching Pursuit, Basis Pursuit, group testing, LASSO, LARS, expectation-maximization, Bayesian estimation algorithm, belief propagation, wavelet-structure exploiting algorithm, Sudocode reconstruction, reconstruction based on manifolds, $l_1$ reconstruction, $l_0$ reconstruction, and $l_2$ reconstruction. The multilayered modulator may comprise first and second disks, wherein the first and second disks spin at different speeds. An imaging plane in the first disk may be aligned diagonally with the first disk. The spindle of the first disk may be aligned with a spindle of the second disk.

In another embodiment, the multilayered modulator comprises first and second cylinders, wherein the first cylinder is nested at least partially within the second cylinder. In yet another embodiment, the multilayered modulator comprises first and second tapes, wherein the first and second tapes move orthogonal to one another. In another embodiment, the multilayered modulator comprises a plurality of masks, the masks having partial patterns that are translated horizontally, vertically and depthwise relative to one another.

In another preferred embodiment, the present invention is an imaging system. The imaging system comprises a multilayered modulator for modulating an incident light field by a series of patterns, a detector, said detector optically computing inner products between said light field and said series of patterns, and a processor. The processor recovers a signal based upon said inner products and at least one of a Greedy reconstruction algorithm, Matching Pursuit, Orthogonal Matching Pursuit, Basis Pursuit, group testing, LASSO, LARS, expectation-maximization, Bayesian estimation algorithm, belief propagation, wavelet-structure exploiting algorithm, Sudocode reconstruction, reconstruction based on manifolds, $l_1$ reconstruction, $l_0$ reconstruction, and $l_2$ reconstruction.

In yet another embodiment, the present invention is a method for acquiring and recovering a signal. The method comprises the steps of modulating an incident light field by a series of patterns with a multilayered modulator, optically computing inner products between said light field and said series of patterns, and recovering a signal based upon said inner products and at least one of a Greedy reconstruction algorithm, Matching Pursuit, Orthogonal Matching Pursuit, Basis Pursuit, group testing, LASSO, LARS, expectation-maximization, Bayesian estimation algorithm, belief propagation, wavelet-structure exploiting algorithm, Sudocode reconstruction, reconstruction based on manifolds, $l_1$ reconstruction, $l_0$ reconstruction, and $l_2$ reconstruction.

In still another embodiment, the present invention is a method for detecting or classifying a signal. The method comprises the steps of modulating an incident light field by a series of patterns with a multilayered modulator, optically computing inner products between said light field and said series of patterns, and comparing the optically computed inner products against a set of target templates or using a statistical test to detect the signal or classify a signal into one of a plurality of classes.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

BRIEF DESCRIPTION OF THE DRAWINGS

For a more complete understanding of the present invention and the advantages thereof, reference is now made to the following description and the accompanying drawings, in which:

FIG. 2A is a diagram illustrating two spinning disks covered with enough adsorbing/scattering area in accordance with a preferred embodiment of the present invention so that the overlap in the image plane designated by the square box leads to approximately 50% attenuation of the signal at the detector.

DETAILED DESCRIPTION OF THE PREFERRED EMBODIMENTS

In previous instances of compressive sensing employed in a single pixel camera, an individual optical modulator such as a digital micromirror device, or DMD, was employed. U.S. Patent Application Publication No. 2006/0239336, which is hereby incorporated by reference in its entirety, disclosed a camera architecture, shown in FIG. 1, which uses for random measurements a digital micromirror array to spatially modulate an incident image and reflecting the result to a lens, which focuses the light to a single photodiode for measurement. Mathematically, such measurements correspond to inner products of the incident image with a sequence of pseudorandom patterns. For an image model the system assumes sparsity or compressibility; that is, that there exists some basis, frame, or dictionary (possibly unknown at the camera) in which the image has a concise representation. For reconstruction, the system and method uses the above model (sparsity/compressibility) and some recovery algorithm (based on optimization, greedy, iterative, or other algorithms) to find the sparsest or most compressible or most likely image that explains the obtained measurements. The camera, however, does not have to rely on reflecting light off a digital micromirror device. The concept is that it can be based on any system that is capable of modulating the incident light field x (be it by transmission, reflection, or other means) by some series of patterns $\phi_m$ and then integrating this modulated light field at a number of points to compute the inner products $y(m)=\langle x\phi_m^T\rangle$ between the light field and the series of patterns (the so-called "incoherent projections" $y=\Phi x$ described below). From these inner products one can recover the original signal (with fewer inner products than the number of pixels ultimately reconstructed). Examples of systems that can modulate light fields include digital micromirror devices (DMD), LCD shutter arrays (as in an LCD laptop projector), physically moving shutter arrays, or any material that can be made more and less transparent to the light field of interest at different points in space, etc.

Figure 1:
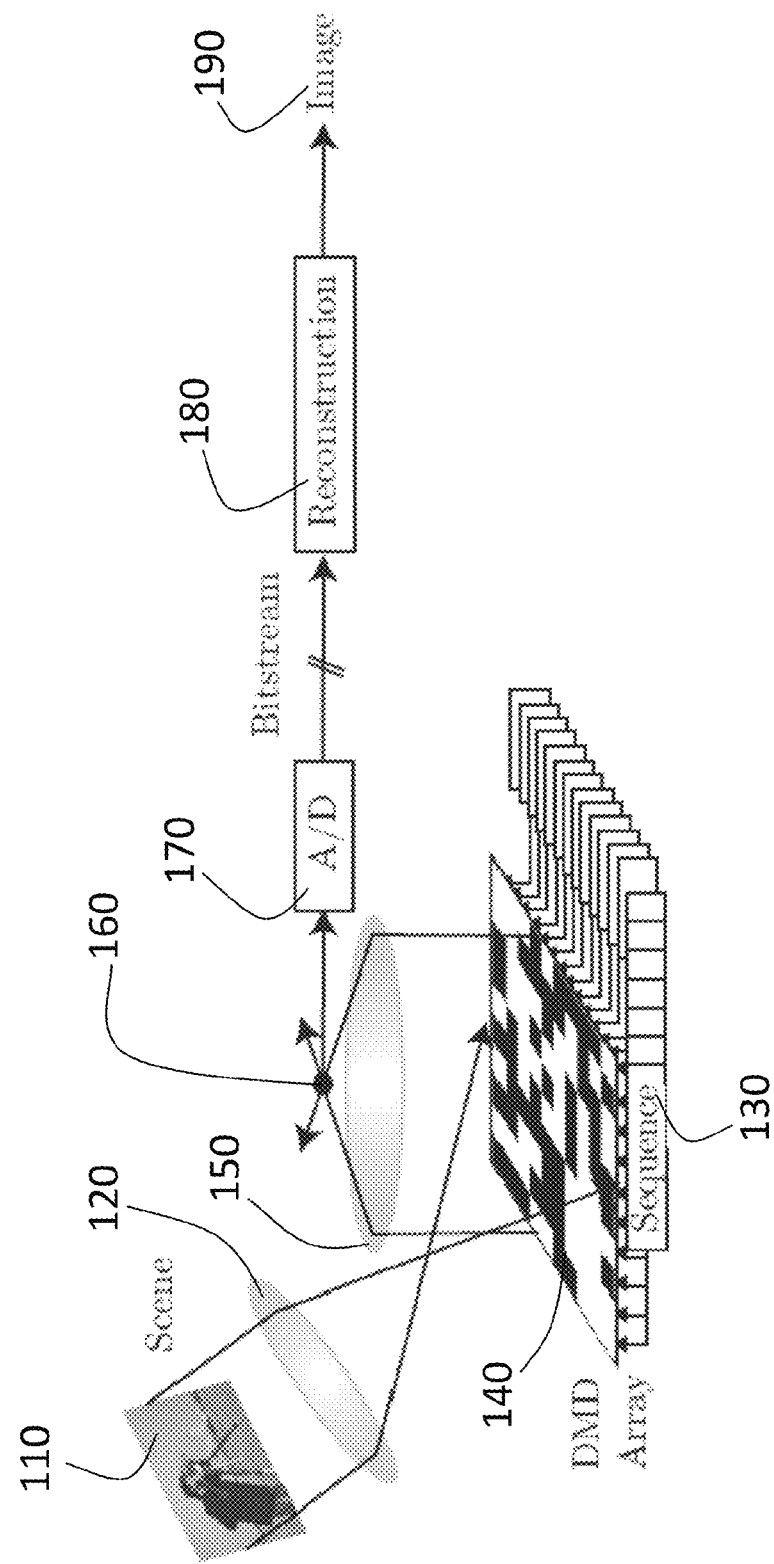
FIG. 1 is a diagram of a compressive imaging camera.

One possible hardware realization of the CI concept is a single detector camera; it combines a micro-controlled mirror array displaying a time sequence of M pseudorandom basis images with a single optical sensor to compute incoherent image measurements y as in (1) (see FIG. 1). By adaptively selecting how many measurements to compute, the system trades off the amount of compression versus acquisition time; in contrast, conventional cameras trade off resolution versus the number of pixel sensors.

FIG. 1 shows a compressive imaging (CI) camera. An incident light field 110 corresponding to the desired image x passes through a lens 120 and is then reflected off a digital micromirror device (DMD) array 140 whose mirror orientations are modulated in the pseudorandom pattern sequence supplied by the random number generator or generators 130. Each different mirror pattern produces a voltage at the single photodiode detector 160 that corresponds to one measurement y(m). While only one photodetector is shown in FIG. 1, any number of detectors may be used, although typically, the number of photodetectors will be less than the total number of ultimate number of pixels obtained in the image. The voltage level is then quantized by an analog-to-digital converter 170. The bitstream produced is then communicated to a reconstruction algorithm 180, which yields the output image 190.

The DMD may consist, for example, of a 1024×768 array of electrostatically actuated micromirrors where each mirror of the array is suspended above an individual SRAM cell. Each mirror rotates about a hinge and can be positioned in one of two states (+12 degrees and −12 degrees from horizontal); thus light falling on the DMD may be reflected in two directions depending on the orientation of the mirrors. Note that the Texas Instruments DMD is one possible embodiment, but many additional embodiments are possible.

Referring again to FIG. 1, with the help of a biconvex lens 120, the desired image is formed on the DMD plane 140; this image acts as an object for the second biconvex lens 150, which focuses the image onto the photodiode 160. The light is collected from one of the two directions in which it is reflected (e.g., the light reflected by mirrors in the +12 degree state). The light from a given configuration of the DMD mirrors 140 is summed at the photodiode 160 to yield an absolute voltage that yields a coefficient y(m) for that configuration. The output of the photodiode 160 is amplified through an op-amp circuit and then digitized by a 12-bit analog to digital converter 170. These are details of one specific embodiment of a CI camera. Various other embodiments are also possible and will be apparent to those of skill in the art.

The present invention expands and improves on the CI camera having DMD, deformable piezoelectric membrane or other single spatial light modulator architectures by replacing an individual light modulator, such as DMD 140 in FIG. 1, with various schemes of multilayered modulators to ease the camera system fabrication, to present a more universal modulation system applicable across the entire electromagnetic spectrum, and to preserve still the benefits of imaging by compressive sensing as previously described. Such a system having multilayered modulators is realizable due to the pseudorandom nature of the patterns employed. The image can be reconstructed, exactly or approximately, from the random projections by using a model, in essence to find the best or most likely image (in some metric) among all possible images that could have given rise to those same measurements.

Two or more masks whose combined attenuation, whether through transmission or reflection, will result in 50% blocking of the light at the detector in a knowable and controllable manner may be employed in either an additive sense in the case of transmissive modulation or in a multiplicative manner in the case of reflective modulation. Once a series of coefficients is assembled from shifting of these masks relative to each other and the detector is obtained, an image can be reconstructed from these compressed measurements. Such a scheme could be realized in many different ways for both binary and Gaussian modulators. Although not limited to the following, some examples outlined below include interdigitated spinning disks, rotating concentric cylinders, and laterally translated planar sheets or tapes. The choice of the material in all cases can be optimized for that particular sensor/detector whether capturing images formed by various portions of the electromagnetic spectrum or, in the case of transmission, also include images formed by but not limited to particles such as electrons and neutrons. The mask can be placed in many possible locations in the optical path including but not limited to the image plane, lens plane, or lens focus. This is a method that is only amenable to compressive sensing based on random or pseudo-random patterns and is not feasible in imaging schemes that employ transform coding. The various compressive imaging systems discussed below directly acquire a reduced set of M incoherent projections of an N-pixel image x without first acquiring the N pixel values.

This compressive imaging system directly acquires a reduced set of M incoherent projections of an N-pixel image x without first acquiring the N pixel values. Since the camera is "progressive," better quality images (larger K) can be obtained by taking a larger number of measurements M. Also, since the data measured by the camera is "future-proof," new reconstruction algorithms based on better sparsifying image transforms can be applied at a later date to obtain even better quality images.

The recovery of the sparse set of significant coefficients $\{\theta(n)\}$ can be achieved using optimization or other algorithms by searching for the signal with $l_0$-sparsest coefficients {θ(n)} that agrees with the M observed measurements in y (recall that typically M<N). That is, we solve the optimization problem $$\theta_r = \operatorname{argmin} \|\theta\|_0 \text{ such that } y = \Phi\Psi\theta. \quad (1)$$

The $l_0$ norm $\|\theta\|_0$ counts the nonzero entries in the vector θ; hence it is a measure of the degree of sparsity, with more sparse vectors having smaller $l_0$ norm.

Unfortunately, solving this optimization problem is prohibitively complex and is believed to be NP-hard (see Candès, E., Tao, T., "Error correction via linear programming," (2005) Preprint). The practical revelation that supports the new CS theory is that it is not necessary to solve the $l_1$-minimization problem to recover the set of significant {θ(n)}. In fact, a much easier problem yields an equivalent solution (thanks again to the incoherency of the bases); we need only solve for the $l_1$-sparsest coefficients θ that agree with the measurements y $$\theta_r = \operatorname{argmin} \|\theta\|_1 \text{ such that } y = \Phi\Psi\theta. \quad (2)$$

The optimization problem (2), also known as Basis Pursuit (see Chen, S., Donoho, D., Saunders, M., "Atomic decomposition by basis pursuit," SIAM J. on Sci. Comp. 20 (1998) 33-61), is significantly more approachable and can be solved with traditional linear programming techniques whose computational complexities are polynomial in N. Although only K+1 measurements are required to recover sparse signals via $l_0$ optimization, one typically requires M~cK measurements for Basis Pursuit with an overmeasuring factor c>1.

We use the notation c to describe the overmeasuring/oversampling constant required in various settings and note the following approximation: The constant c satisfies c≈log 2 (1+N/K).

While reconstruction based on linear programming is one preferred embodiment, any reconstruction approach can be used in the present invention. Other examples include the (potentially more efficient) iterative Orthogonal Matching Pursuit (OMP) (see Tropp, J., Gilbert, A. C., "Signal recovery from partial information via orthogonal matching pursuit," (2005) Preprint), matching pursuit (MP)(see Mallat, S. and Zhang, Z., "Matching Pursuit with Time Frequency Dictionaries", (1993) IEEE Trans. Signal Processing 41(12): 3397-3415), tree matching pursuit (TMP) (see Duarte, M. F., Wakin, M. B., Baraniuk, R. G., "Fast reconstruction of piecewise smooth signals from random projections," Proc. SPARS05, Rennes, France (2005)) algorithms, group testing (see Cormode, G., Muthukrishnan, S., "Towards an algorithmic theory of compressed sensing," DIMACS Tech. Report 2005-40 (2005), Sudocodes (see U.S. Provisional Application Ser. No. 60/759,394 entitled "Sudocodes: Efficient Compressive Sampling Algorithms for Sparse Signals," and filed on Jan. 16, 2006), or statistical techniques such as Belief Propagation, (see Pearl, J., "Fusion, propagation, and structuring in belief networks", (1986) Artificial Intelligence, 29(3): 241-288), LASSO (see Tibshirani, R., "Regression shrinkage and selection via the lasso", (1996) J. Royal. Statist. Soc B., 58(1): 267-288), LARS (see Efron, B., Hastie, T., Johnstone, I., Tibshirani, R., "Least Angle Regression", (2004) Ann. Statist. 32(2): 407-499), Basis Pursuit with Denoising (see Chen, X., Donoho, D., Saunders, M., "Atomic Decomposition by Basis Pursuit", (1999), SIAM Journal on Scientific Computing 20(1): 33-61), expectation-maximization (see Dempster, Laird, N., Rubin, D., "Maximum likelihood from incomplete data via the EM algorithm", (1997) Journal of the Royal Statistical Society, Series B, 39(1): 1-38), and so on. These methods have also been shown to perform well on compressible signals, which are not exactly K-sparse but are well approximated by a K-term representation. Such a model is more realistic in practice.

Reconstruction can also be based on other signal models, such as manifolds (see Wakin, M, and Baraniuk, R., "Random Projections of Signal Manifolds" IEEE ICASSP 2006, May 2006, to appear). Manifold models are completely different from sparse or compressible models. Reconstruction algorithms in this case are not necessarily based on sparsity in some basis/frame, yet signals/images can be measured using the systems described here.

The systems described here can also be used to acquire a collection of images or video sequences. Each image or video can be viewed as a point in N-dimensional Euclidean space. Therefore, the collection of images/videos forms a point cloud in N dimensional Euclidean space. Incoherent projections as implemented in our systems will keep different images/videos well-separated and preserve the neighborhood relationships among similar signals, even if we never intend to reconstruct these images/videos (see Dasgupta, S., Gupta, A., "An elementary proof of the Johnson-Lindenstrauss lemma," Tech. Rep. TR-99-006, Berkeley, Calif., 1999). The point cloud approach is useful for posing and solving decision problems with collections of images/videos, such as detection, classification, recognition, tracking, registration, and other problems.

The systems described here can also be used to detect the presence of a signal and/or classify a signal into one of a plurality of classes. To accomplish such a task, one can compare the measurements computed by systems described here against a set of target templates that have been precomputed and stored. Such an approach is known in the compressive sensing literature as smashed filtering (see M. A. Davenport, P. T. Boufounos, M. B. Wakin, and R. G. Baraniuk, "Signal processing with compressive measurements", *Journal of Selected Topics in Signal Processing*, vol. 4, no. 2, pp. 445-460, April, 2010). Alternatively, one can use a statistical test such as a likelihood ratio test to detect the presence or lack thereof of the signal.

The preferred embodiment is to reconstruct an N-pixel image or video sequence from M<N measurements. Additional embodiments using more measurements are possible. For example, if we use M=N or M>N measurements, then the extra measurements can be used for subsequent processing. For example, additional measurements may be used for averaging or filtering when the image is noisy or corrupted in some way.

The present invention is further described below with reference to FIGS. 2-8. For purposes of simplicity, most of FIGS. 2-8 only illustrate two layers but it will be understood by those of skill in the art that the principal is easily extended to more than two.

As shown in FIG. 2A, in a preferred embodiment of the present invention the CI camera has a multilayered modulator 200 in the form of two spinning disks 210, 220 that are covered with enough adsorbing/scattering area so that the overlap in the image plane designated by the square box 230 leads to approximately 50% attenuation of the signal at the detector. To minimize the correlation of the combined patterns the two disks 210, 220 should be rotating at different speeds such as 3333 Hz and 5000 Hz. The appropriate choice of the speeds could also maximize the number of patterns before repetition begins. The solid lines 240, 250 represent synchronization points on the wheel determined either optically or by a non-optical method such as placement of a small magnet on the disk and the inclusion of a nearby Hall-effect sensor.

Thus, in a preferred embodiment of the present invention, a multilayered modulator comprising a plurality of discs, such as are shown in FIG. 2A, modulate an incident light field by a series of patterns to produce a voltage or voltages at a detector or detectors. The detector measurements can be interpreted as optically computed inner products between the light field and the series of patterns. A processor (item 180 in FIG. 1) recovers the signal based upon the inner products and an algorithm. The algorithm may be, for example, at least one of a Greedy reconstruction algorithm, Matching Pursuit, Orthogonal Matching Pursuit, Basis Pursuit, group testing, LASSO, LARS, expectation-maximization, Bayesian estimation algorithm, belief propagation, wavelet-structure exploiting algorithm, Sudocode reconstruction, reconstruction based on manifolds, $l_1$ reconstruction, $l_0$ reconstruction, and $l_2$ reconstruction.

Figure 2B:
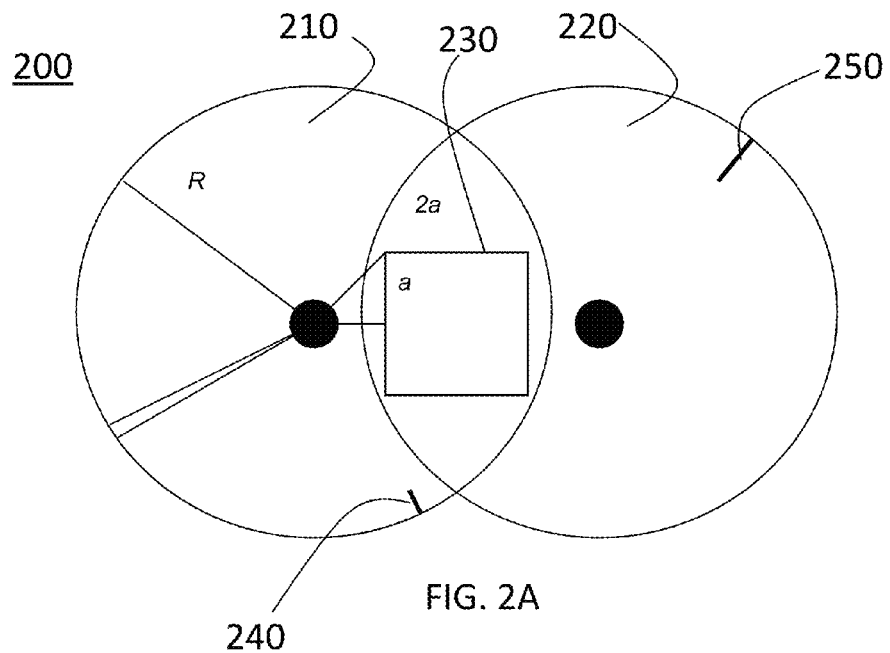
FIG. 2B is a diagram illustrating an individual wheel of the two where the image plane is rotated 45 degrees so that its diagonal aligns radially with the disk, which would minimize the footprint of the overall device and maximize the patterns on the wheel.
Figure 2B:
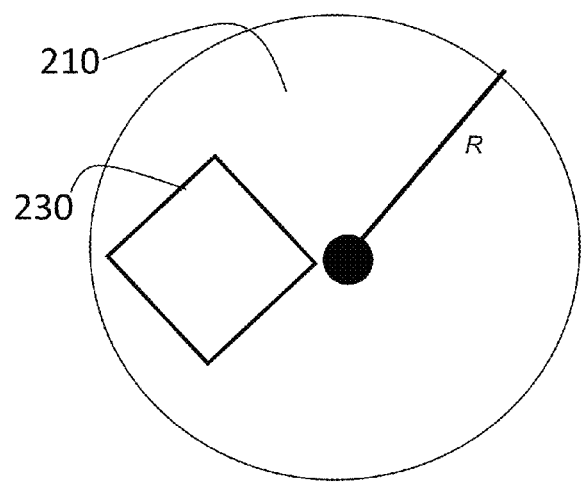
Figure 3:
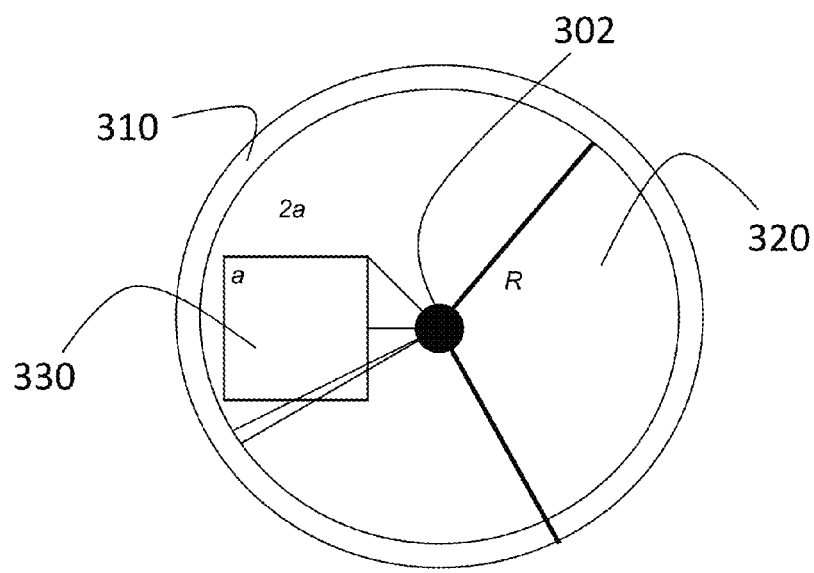
FIG. 3 is a diagram illustrating almost the complete minimal footprint of the device by having both disks with their spindles aligned but still spinning at different speeds in accordance with a preferred embodiment of the present invention. This also allows the opportunity to add more image planes in the other space and thus more sensors.
Figure 4:
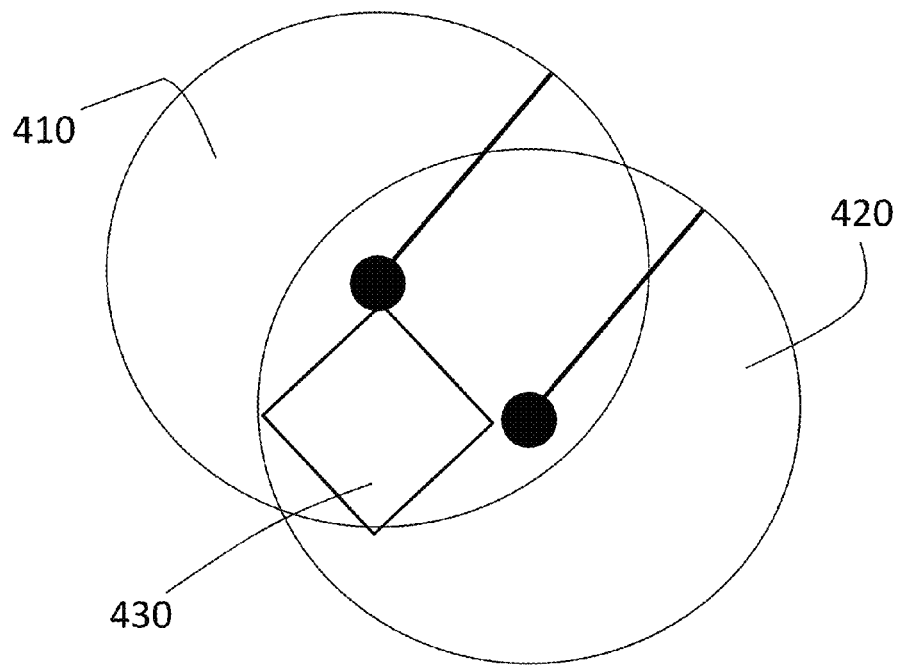
FIG. 4 is a diagram where the overlap of the image planes of the two discs are perpendicular to each other in accordance with a preferred embodiment of the present invention, allowing for maximum entropy in the combination of the partial patterns.

Variations in the arrangements of the discs in the multilayer modulator may be used. In FIG. 2B, the image plane 230 of an individual wheel or disk 210 of two disks such as are shown in FIG. 2A is rotated 45 degrees so that its diagonal aligns radially with the disk, which would minimize the footprint of the overall device and maximize the patterns on the wheel 230. FIG. 3 is a diagram showing an embodiment having an almost complete minimal footprint by having both disks 310, 320 with the spindles 302, 304 aligned but still spinning at different speeds. This also allows the opportunity to add more image planes 330 in the other space and thus more sensors. FIG. 4 is a diagram where the overlapping image planes of the two discs 410, 420 are perpendicular to each other, allowing for maximum entropy in the combination of the partial patterns.

Figure 5A:
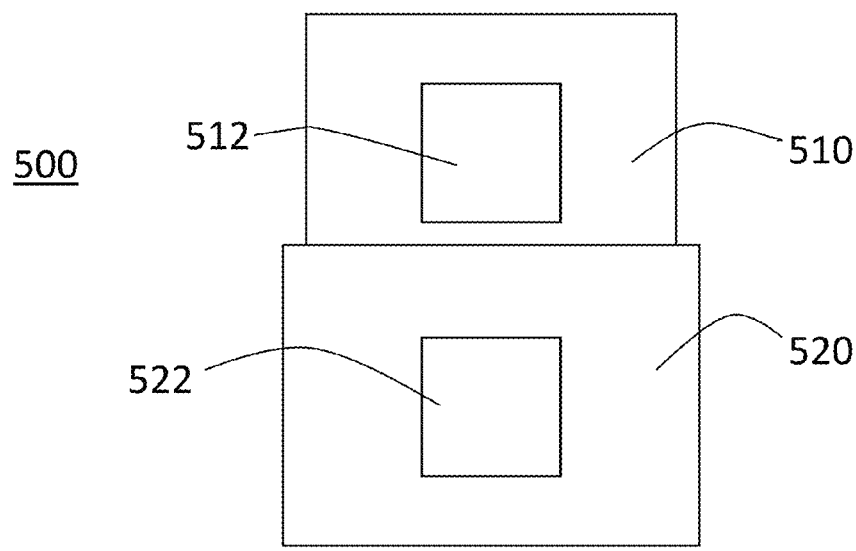
FIG. 5A is a side view of an embodiment of the present invention in which the disc system is replaced with two nested cylinders.
Figure 5B:
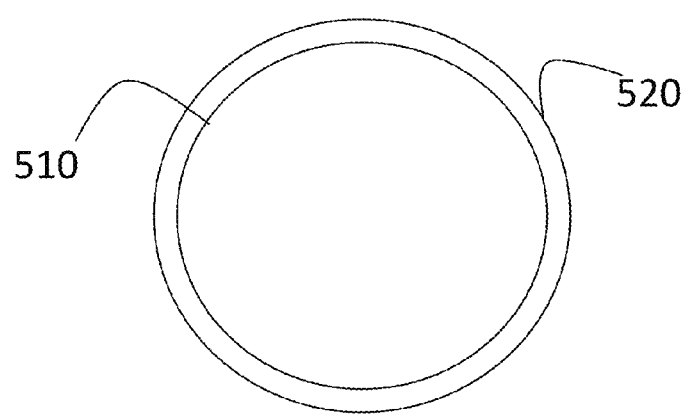
FIG. 5B is a top view of an embodiment of the present invention in which the disc system is replaced with two nested cylinders.

Other embodiments may incorporate multilayered modulators other than discs. FIGS. 5A and 5B illustrate another embodiment of the present invention in which the disc system of FIG. 2A is replaced with multilayered modulator 500, which has with two nested cylinders 510, 520 having image planes 512 and 522. In the embodiment shown in FIG. 6, modulation is accomplished with a pair of tapes 610, 620 moving orthogonal to each other rather than with a pair of discs.

Figures 6, 7:
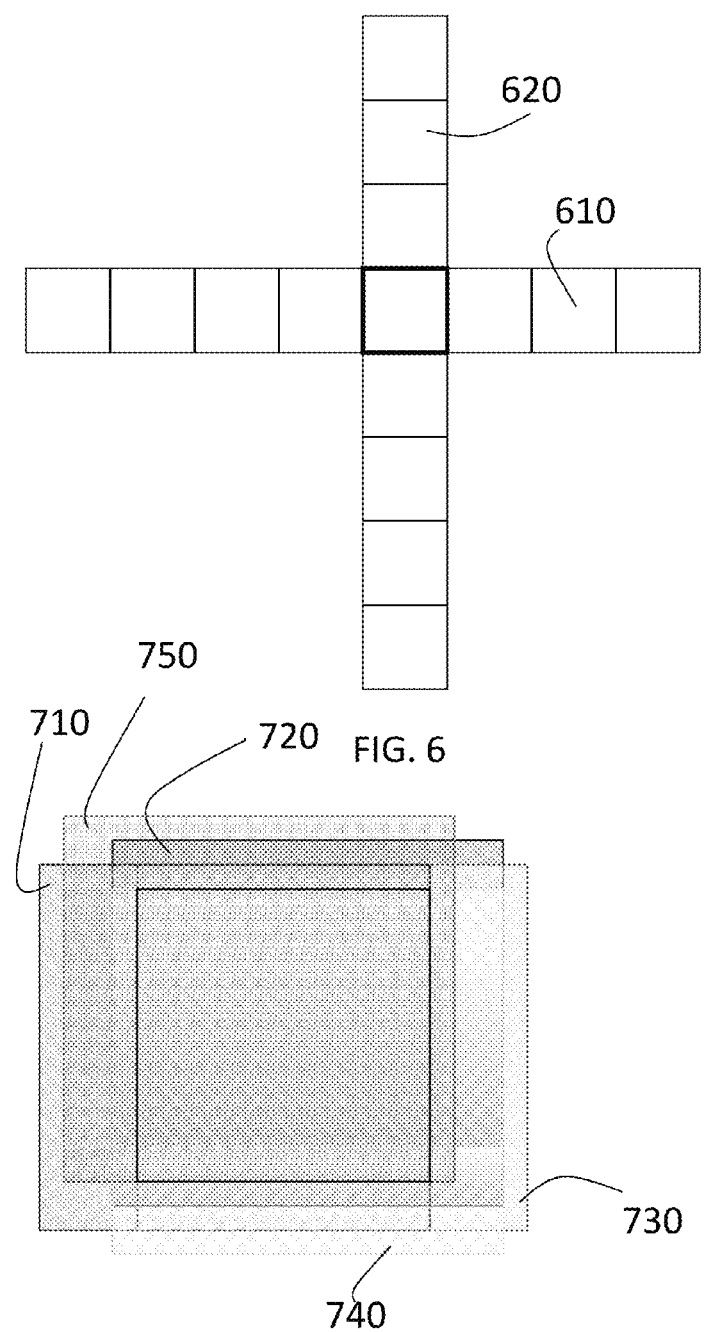
FIG. 6 is a diagram of a pair of tapes moving orthogonal to each other in accordance with another preferred embodiment of the present invention.
FIG. 7 is a diagram showing individual masks with partial patterns that may be translated horizontally, vertically, and depthwise relative to each other in various preferred embodiments of the present invention.

Further, FIG. 7 illustrates a plurality of individual masks 710, 720, 730, 740 and 750, with partial patterns that may be translated horizontally, vertically, and depthwise relative to each other in various embodiments. Their motion could be controlled by many different means one example is to employ piezoelectric transducers.

Figure 8:
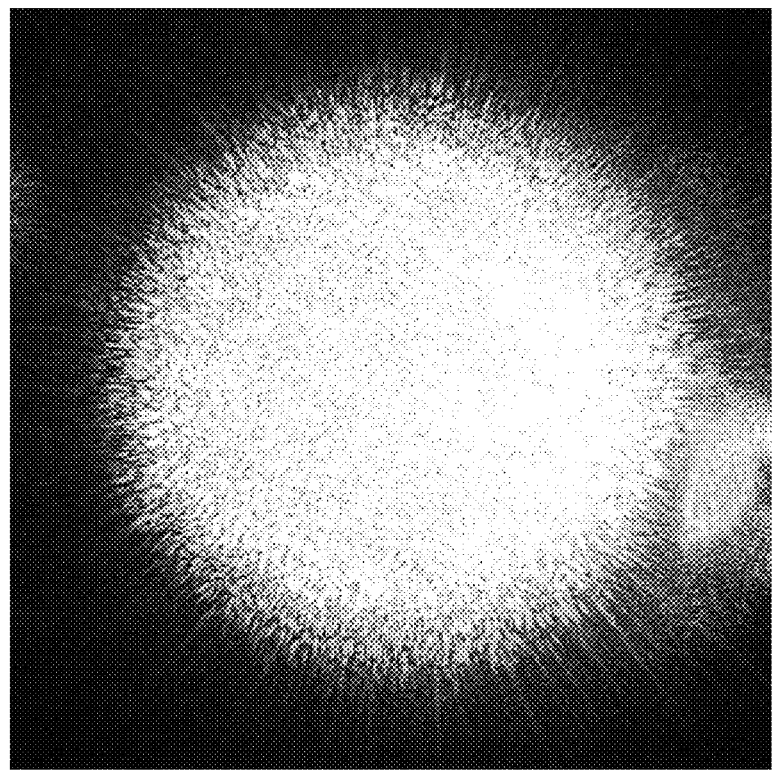
FIG. 8 is an illustration of a speckle pattern. A combination of translating and rotating speckle patterns could generate enough randomness to acquire the compressive coefficients for reconstruction into an image. A speckle pattern could also be used in combination with a more traditional light modulator such as digital micromirrors or liquid crystals as a combination modulator.

FIG. 8 is a picture of a speckle pattern. A combination of translating and rotating speckle patterns could generate enough randomness to acquire the compressive coefficients for reconstruction into an image. A speckle pattern could also be used in combination with a more traditional light modulator such as digital micromirrors or liquid crystals as a combination modulator.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. An imaging system comprising:
   a multilayered modulator for modulating an incident light field by a series of patterns, wherein said multilayered modulator comprises a plurality of disks, wherein each of said plurality of disks spins at a different speed;
   means for optically computing inner products between the light field and said series of patterns; and
   means for recovering a signal based upon said inner products and at least one of a Greedy reconstruction algorithm, Matching Pursuit, Orthogonal Matching Pursuit, Basis Pursuit, group testing, LASSO, LARS, expectation-maximization, Bayesian estimation algorithm, belief propagation, wavelet-structure exploiting algorithm, Sudocode reconstruction, reconstruction based on manifolds, $l_1$ reconstruction, $l_0$ reconstruction, and $l_2$ reconstruction.

2. An imaging system according to claim 1, wherein said plurality of disks have a combined attenuation that results in 50% blocking of light at the means for optically computing inner products.

3. An imaging system according to claim 1, wherein said series of patterns are random or psuedorandom.

4. An imaging system according to claim 1, wherein said plurality of disks comprises first and second disks.

5. An imaging system according to claim 4, wherein an imaging plane in said first disk is aligned diagonally with said second disk.

6. An imaging device according to claim 4, wherein a spindle of said first disk is aligned with a spindle of said second disk.

7. An imaging device according to claim 1, wherein as least one of said plurality of disks translates horizontally, vertically or depthwise relative to at least one other of said plurality of disks.

8. An imaging system comprising:
   a multilayered modulator for modulating an incident light field by a series of patterns, wherein said multilayered modulator comprises a plurality of disks, wherein each of said plurality of disks spins at a different speed;
   a detector, said detector optically computing inner products between said light field and said series of patterns; and
   a processor, said processor recovering a signal based upon said inner products and at least one of a Greedy reconstruction algorithm, Matching Pursuit, Orthogonal Matching Pursuit, Basis Pursuit, group testing, LASSO, LARS, expectation-maximization, Bayesian estimation algorithm, belief propagation, wavelet-structure exploiting algorithm, Sudocode reconstruction, reconstruction based on manifolds, $l_1$ reconstruction, $l_0$ reconstruction, and $l_2$ reconstruction.

9. An imaging system according to claim 8, wherein said plurality of disks comprises first and second disks.

10. An imaging system according to claim 9, wherein an imaging plane in said first disk is aligned diagonally with said second disk.

11. An imaging device according to claim 9, wherein a spindle of said first disk is aligned with a spindle of said second disk.

12. An imaging system according to claim 8, wherein said plurality of disks have a combined attenuation that results in 50% blocking of light at the means for optically computing inner products.

13. An imaging device according to claim 8, wherein as least one of said plurality of disks translates horizontally, vertically or depthwise relative to at least one other of said plurality of disks.

14. A method for acquiring and recovering a signal, the method comprising the steps of:
   modulating an incident light field by a series of patterns with a multilayered modulator having a plurality of disks, wherein at least two of said plurality of disks spin at different speeds;
   optically computing inner products between said light field and said series of patterns; and
   recovering a signal based upon said inner products and at least one of a Greedy reconstruction algorithm, Matching Pursuit, Orthogonal Matching Pursuit, Basis Pursuit, group testing, LASSO, LARS, expectation-maximization, Bayesian estimation algorithm, belief propagation, wavelet-structure exploiting algorithm, Sudocode reconstruction, reconstruction based on manifolds, $l_1$ reconstruction, $l_0$ reconstruction, and $l_2$ reconstruction.

15. A method according to claim 14, wherein an imaging plane in a first of said plurality of disks is aligned diagonally with a second of said plurality of disks.

16. A method according to claim 14, wherein a spindle of a first of said plurality of disks is aligned with a spindle of second of said plurality of disks.

17. A method according to claim 14, wherein said series of patterns are random or psuedorandom.

18. A method according to claim 14, wherein said plurality of disks have a combined attenuation that results in 50% blocking of light at the means for optically computing inner products.

19. A method for detecting or classifying a signal, the method comprising the steps of:
   modulating an incident light field by a series of patterns with a multilayered modulator having first and second disks, wherein said first and second disks spin at different speeds;
   optically computing inner products between said light field and said series of patterns; and
   comparing the optically computed inner products against a set of target templates or using a statistical test to detect the signal or classify a signal into one of a plurality of classes.

20. A method according to claim 19, wherein said series of patterns are random or psuedorandom.

* * * * *